US012287359B1

(12) United States Patent
Pryor et al.

(10) Patent No.: US 12,287,359 B1
(45) Date of Patent: Apr. 29, 2025

(54) USING NEAR-FIELD TESTING TO DETERMINE HOW A RADOME AFFECTS THE RF CHARACTERISTICS OF AN ANTENNA

(71) Applicant: Resonant Sciences, LLC, Beavercreek, OH (US)

(72) Inventors: Jonothan Pryor, Bellbrook, OH (US); Brent Collins, Bellbrook, OH (US); Nathan Thomas Kornbau, Beavercreek, OH (US); Jeremy Micah North, Dayton, OH (US); Kurt Strickler, Mansfield, OH (US); Mark Scott, Decatur, GA (US)

(73) Assignee: Resonant Sciences, LLC, Beavercreek, OH (US)

(*) Notice: Subject to any disclaimer, the term of this patent is extended or adjusted under 35 U.S.C. 154(b) by 156 days.

(21) Appl. No.: 17/990,313

(22) Filed: Nov. 18, 2022

Related U.S. Application Data

(60) Provisional application No. 63/280,784, filed on Nov. 18, 2021.

(51) Int. Cl.
    *G01R 29/10* (2006.01)
    *G01R 29/08* (2006.01)

(52) U.S. Cl.
    CPC .......... *G01R 29/10* (2013.01); *G01R 29/0878* (2013.01)

(58) Field of Classification Search
    CPC ...... G01R 29/10; G01R 29/0878; G01R 1/04; G01R 1/0408; G01R 29/00; G01R 29/08; G01R 29/0807; G01R 29/0864; G01R 29/02; G01R 29/04; G01R 29/06; G01R 29/105; G01R 35/00; G01R 35/005; G01R 35/007; H01Q 1/405; H01Q 7/00; H01Q 21/00; H01Q 21/06; H01Q 21/30; H01Q 21/29; H01Q 21/24; H01Q 21/26
    See application file for complete search history.

(56) References Cited

U.S. PATENT DOCUMENTS

| | | | |
|---|---|---|---|
| 4,035,734 A | 7/1977 | Flormann et al. | |
| 4,327,438 A | 4/1982 | Baier et al. | |
| 4,475,246 A | 10/1984 | Batlivala et al. | |
| 5,371,505 A * | 12/1994 | Michaels | H01Q 1/42 |
| | | | 324/639 |

(Continued)

FOREIGN PATENT DOCUMENTS

| | | |
|---|---|---|
| EP | 2868004 B1 | 2/2018 |
| WO | 2013062547 A1 | 5/2013 |
| WO | 2020074667 A1 | 4/2020 |

OTHER PUBLICATIONS

U.S. Appl. No. 17/358,997, filed Jun. 25, 2021, Al Saulnier.

(Continued)

*Primary Examiner* — Alvaro E Fortich
(74) *Attorney, Agent, or Firm* — Christopher M. Ramsey; GrayRobinson, P.A.

(57) ABSTRACT

An RF characterization system includes a processor that executes program instructions to determine how a radome affects RF characteristics of an antenna by retrieving near field measurement data of the radome and antenna, receiving an electronic image representation of the radome, and obtaining near field RF properties of the radome and antenna by combining the near field measurement data and the electronic image representation.

23 Claims, 6 Drawing Sheets

(56) References Cited

U.S. PATENT DOCUMENTS

| | | | |
|---|---|---|---|
| 5,481,572 A | 1/1996 | Skold et al. | |
| 5,912,644 A | 6/1999 | Wang | |
| 5,963,847 A | 10/1999 | Ito et al. | |
| 6,912,644 B1 | 6/2005 | O'Connor et al. | |
| 7,555,219 B2 | 6/2009 | Cox et al. | |
| 7,633,435 B2 | 12/2009 | Meharry et al. | |
| 7,756,002 B2 | 7/2010 | Batra et al. | |
| 8,135,339 B2 | 3/2012 | Ranson et al. | |
| 8,285,201 B2 | 10/2012 | Gore et al. | |
| 8,503,926 B2 | 8/2013 | Gainey et al. | |
| 8,571,470 B2 | 10/2013 | Ranson et al. | |
| 8,630,211 B2 | 1/2014 | Gainey et al. | |
| 8,725,067 B2 | 5/2014 | Ahn et al. | |
| 8,755,750 B2 | 6/2014 | Cox et al. | |
| 8,868,006 B2 | 10/2014 | Cox et al. | |
| 8,879,433 B2 | 11/2014 | Khojastepour et al. | |
| 9,209,840 B2 | 12/2015 | Cox | |
| 9,461,698 B2 | 10/2016 | Moffatt et al. | |
| 9,612,320 B2 | 4/2017 | Morvan et al. | |
| 10,218,490 B1 | 2/2019 | Yang et al. | |
| 11,057,067 B1 | 7/2021 | Hickle et al. | |
| 11,121,473 B2 | 9/2021 | Chapman et al. | |
| 11,362,694 B1 | 6/2022 | Laufer et al. | |
| 11,405,171 B2 | 8/2022 | Khude et al. | |
| 2001/0029186 A1 | 10/2001 | Canyon et al. | |
| 2004/0032904 A1 | 2/2004 | Orlik et al. | |
| 2005/0017897 A1* | 1/2005 | Monk | H01Q 1/281 342/174 |
| 2006/0251148 A1 | 11/2006 | Welborn et al. | |
| 2009/0175365 A1 | 7/2009 | Jun | |
| 2011/0007852 A1 | 1/2011 | Kimata | |
| 2011/0170473 A1 | 7/2011 | Proctor, Jr. et al. | |
| 2011/0286605 A1 | 11/2011 | Furuta et al. | |
| 2012/0170482 A1 | 7/2012 | Hwang et al. | |
| 2012/0213312 A1 | 8/2012 | Futatsugi et al. | |
| 2013/0244710 A1 | 9/2013 | Nguyen et al. | |
| 2013/0314271 A1 | 11/2013 | Braswell et al. | |
| 2014/0194054 A1 | 7/2014 | Kim | |
| 2014/0204808 A1 | 7/2014 | Choi et al. | |
| 2015/0269449 A1 | 9/2015 | Kosaki | |
| 2015/0270865 A1 | 9/2015 | Polydoros et al. | |
| 2015/0326380 A1 | 11/2015 | Verbin et al. | |
| 2016/0254007 A1 | 9/2016 | Guo et al. | |
| 2017/0257868 A1 | 9/2017 | Wang et al. | |
| 2017/0280351 A1 | 9/2017 | Skaaksrud | |
| 2017/0356941 A1* | 12/2017 | Ahmed | G01S 7/4004 |
| 2018/0076847 A1 | 3/2018 | Ju et al. | |
| 2019/0097707 A1 | 3/2019 | Cox et al. | |
| 2019/0207738 A1 | 7/2019 | Son et al. | |
| 2019/0274030 A1 | 9/2019 | Bidot et al. | |
| 2019/0310681 A1 | 10/2019 | Shainwald et al. | |
| 2019/0339318 A1* | 11/2019 | Liu | G01R 29/08 |
| 2020/0049751 A1* | 2/2020 | Salazar Cerreno | G01S 7/40 |
| 2020/0053835 A1 | 2/2020 | Ye et al. | |
| 2020/0099504 A1 | 3/2020 | Erricolo et al. | |
| 2020/0245363 A1 | 7/2020 | Kim et al. | |
| 2020/0252115 A1 | 8/2020 | Paramesh et al. | |
| 2020/0252806 A1 | 8/2020 | Yerramalli et al. | |
| 2020/0373658 A1* | 11/2020 | Iluz | H01Q 15/0026 |
| 2021/0028897 A1 | 1/2021 | Park et al. | |
| 2021/0273773 A1 | 9/2021 | Yi et al. | |
| 2021/0274381 A1 | 9/2021 | Teyeb | |
| 2021/0349138 A1* | 11/2021 | Pfeiffer | G01S 7/4004 |
| 2021/0377912 A1 | 12/2021 | Hamss et al. | |
| 2022/0094512 A1 | 3/2022 | Kolodziej | |
| 2022/0150730 A1 | 5/2022 | Freda et al. | |
| 2022/0159674 A1 | 5/2022 | Deng et al. | |

OTHER PUBLICATIONS

Carusone et al.; "Analogue Adoptive Filters: Past and Present"; IEE Proc., Circuits Devices System; vol. 147, No. 1; Feb. 2000.

Nawankwo et al.; "A Survey Of Self-Interference Management Techniques For Single Frequency Full Duplex Systems"; IEEE Access; vol. 6; pp. 30242-30268; 2018.

Office Action of Oct. 28, 2022 for U.S. Appl. No. 17/358,997.

Office Action of Dec. 7, 2022 for U.S. Appl. No. 17/358,939.

Bouzidi et al.; "RCS Predictions From Planar Near-Field Measurements"; Progress in Electromagnetics Research M, vol. 22; pp. 41-55; 2012.

Liu et al.; "Radar Cross Section Near-Field To Far-Field Prediction For Isotropic-Point Scattering Target Based On Regression Estimation"; MDPI Journal, Sensors; vol. 20; Oct. 23, 2020.

* cited by examiner

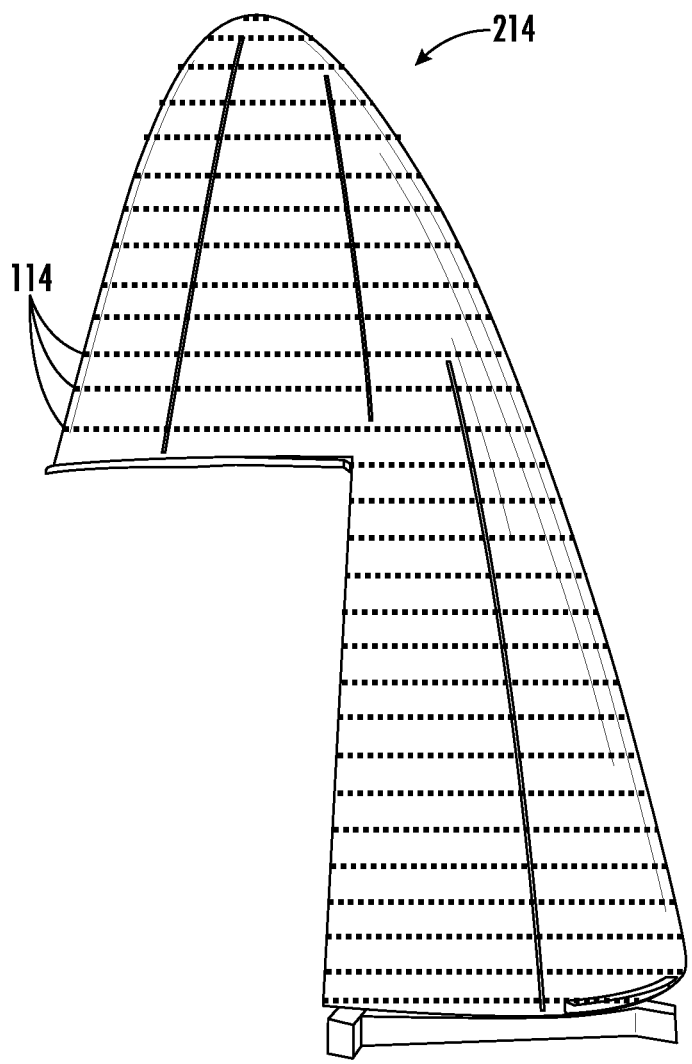

FIG. 5

| POSITION 1 | FREQUENCY | POLARIZATION | INCIDENCE ANGLE | ANTENNA S-PARAMETERS |
|---|---|---|---|---|
| POSITION 2 | FREQUENCY | POLARIZATION | INCIDENCE ANGLE | ANTENNA S-PARAMETERS |
| POSITION 3 | FREQUENCY | POLARIZATION | INCIDENCE ANGLE | ANTENNA S-PARAMETERS |
| POSITION 4 | FREQUENCY | POLARIZATION | INCIDENCE ANGLE | ANTENNA S-PARAMETERS |
| ↓ | ↓ | ↓ | ↓ | ↓ |
| POSITION N | FREQUENCY | POLARIZATION | INCIDENCE ANGLE | ANTENNA S-PARAMETERS |

FIG. 6

USING NEAR-FIELD TESTING TO DETERMINE HOW A RADOME AFFECTS THE RF CHARACTERISTICS OF AN ANTENNA

CROSS-REFERENCE TO RELATED APPLICATION

This claims the benefit of priority to Application No. 63/280,784, entitled "Using Near Field Testing to Determine How a Radome Affects the RF Characteristics of an Antenna" filed Nov. 18, 2021, which is incorporated by reference in its entirety.

BACKGROUND

A radome is a structural enclosure over a radar antenna. Radomes are often found on aircraft, ships, and vehicles carrying radar equipment. Although radomes are designed to be mostly transparent to the radiation transmitted by the antenna, radomes have an electromagnetic interaction with the transmitted beam. The radome may cause beam deflection, reflections, insertion loss, and other problems. Thus, it is useful to know how a given radome will affect the performance of the radar antenna with which it is used prior to actual use in the field.

Traditional radome testing systems require the use of an actual antenna and radome installed on a positioner capable of independently orienting the radome and antenna in an arbitrary direction. The positioner is either installed in a far-field outdoor test range or in the quiet zone of an indoor compact range. A null seeker system may also be used. The antenna is steered to a desired pointing direction and the sum pattern peak or difference pattern null is found by moving the antenna/radome combination about azimuth and elevation directions until the sum peak or difference null is pointing downrange. This test is performed twice for each desired beam direction, once for the antenna alone and once with the radome installed over the antenna. The difference in position of the sum peak or difference null is the beam deflection error, and the difference in the amplitude of the sum peak is the insertion loss introduced by the radome.

BRIEF SUMMARY

What is needed is an RF system and method for characterizing radomes that permits more robust and efficient characterization of the radome in the near-field.

An example of such a method includes determining, by a processor, near field properties of a radome and antenna by combining near field measurement data of the radome and antenna with an electronic image representation of the radome. The near field measurement data include (a) position identifiers that identify positions on the radome where the near field measurement data were measured and (b) RF parameters measured at the positions on the radome identified by the position identifiers. The electronic image representation of the radome including positions thereon corresponding to the position identifiers.

This method may also include one or more of the following features.

The RF parameters may include S parameters.

The near field measurement data may further include (c) incidence angles of the antenna relative to the radome at the positions on the radome identified by the position identifiers.

The near field properties may include at least one of insertion loss, beam deflection error, beam deflection error slope, sidelobe levels, null depth variation, and cross-polarization discrimination.

The method may further include determining far field RF properties of the radome from the near field properties of the radome.

The method may further include predicting pattern effects of the radome from a different antenna using the near field properties.

The electronic image representation of the radome may be a digital three-dimensional representation of the radome.

An example of such a system includes a processor that executes program instructions to characterize a radome and antenna by determining, by a processor, near field properties of the radome and antenna by combining near field measurement data of the radome and an electronic image representation of the radome. The near field measurement data include (a) position identifiers that identify positions on the radome where the near field measurement data were measured and (b) RF parameters measured at the positions on the radome identified by the position identifiers. The electronic image representation of the radome includes positions thereon corresponding to the position identifiers.

This system may also include one or more of the following features.

The RF parameters may include S-parameters.

The near field measurement data may include (c) incidence angles of the antenna relative to the radome at the positions on the radome identified by the position identifiers.

The near field properties may include at least one of insertion loss, beam deflection error, beam deflection error slope, sidelobe levels, null depth variation, and cross-polarization discrimination.

The processor may further execute program instructions to determine far field RF properties of the radome and antenna from the near field properties of the radome and antenna.

The processor may further execute program instructions to predict RF pattern effects of the radome from a different antenna using the near field properties.

The electronic image representation of the radome may be a digital three-dimensional representation of the radome.

An example of an RF characterization system includes a radome supported by a radome support member. A transmit antenna is positioned on a first side of the radome by a first robotic arm. A receive antenna is positioned on a second side of the radome by a second robotic arm. A vector network analyzer is in communication with the transmit antenna and receive antenna. A processor executes program instructions to determine how the radome affects RF characteristics of the transmit antenna by moving the transmit antenna and the receive antenna with the first robotic arm and the second robotic arm, respectively, to different positions of the radome and collecting near field measurement data of the radome and antenna at the different positions. The near field measurement data include (a) a plurality of position identifiers that identify the different positions on the radome where the near field measurement data were measured and (b) RF parameters measured at the positions on the radome identified by the position identifiers.

This system may also include one or more of the following features.

The processor may further execute program instructions to determine how the radome affects RF characteristics of the antenna by receiving an electronic image representation of the radome, the electronic image representation of the radome including positions thereon corresponding to the position identifiers; and obtaining near field RF properties of the radome, transmit antenna, and receive antenna by combining the near field measurement data and the electronic image representation.

The RF parameters may include S-parameters.

The near field measurement data may include (c) incidence angles of the transmit antenna relative to the radome at the positions on the radome identified by the position identifiers.

The RF parameters may include at least one of insertion loss, beam deflection error, beam deflection error slope, sidelobe levels, null depth variation, and cross-polarization discrimination.

The processor may further execute program instructions to determine far field RF properties of the radome and antenna from the RF properties.

The processor may further execute program instructions to predict pattern effects of the radome from a different antenna using the near field RF properties.

The electronic image representation of the radome may be a digital three-dimensional representation of the radome.

An example of a system for predicting pattern effects of a radome on a test antenna, includes a processor that executes program instructions to calculate pattern effects of the radome on the test antenna using near field measurement data and an electronic image representation of the radome. The near field measurement data include (a) a plurality of position identifiers that identify positions on the radome where the near field measurement data were measured and (b) RF parameters measured at the positions on the radome identified by the position identifier. The electronic image representation of the radome includes positions thereon corresponding to the position identifiers.

These systems and methods may also include any combination of these features.

BRIEF DESCRIPTION OF THE DRAWINGS

FIG. 5 is an exterior view of an example of a radome, showing position identifiers.

FIG. 6 is an example of a reference dataset of the near field measurement data.

DETAILED DESCRIPTION OF EXAMPLE EMBODIMENTS

This disclosure describes exemplary embodiments, but not all possible embodiments of the systems and methods. Where a particular feature is disclosed in the context of a particular example, that feature can also be used, to the extent possible, in combination with and/or in the context of other examples. The systems and methods may be embodied in many different forms and should not be construed as limited to only the examples described here.

The systems and methods described here include near field radio frequency (RF) characterization of a radome and antenna. The term "near field" means the radome and antenna under test are in close proximity to one another, such as within several feet or within any distance conventionally considered in the field to constitute near field testing. Near field testing is typically conducted within the Fresnel region where the transition from reactive to radiative behavior is located. Near field RF testing is typically performed indoors in a controlled environment, but it may also be performed in other environments.

The antenna may be any conventional RF antenna used in combination with a radome. A radome is an antenna enclosure that protects the antenna from the weather and other environmental conditions. Although radomes are typically designed to attenuate the RF signals passing therethrough as little as possible, the reality is that the radomes do affect the RF characteristics of the antenna. The radome, for example, may introduce insertion loss, insertion phase delay, return loss, and return phase delay in the antenna's RF parameters. The radome may also influence the antenna's radiation pattern, which is a three-dimensional pattern representing the positional dependence of the electromagnetic fields near the antenna and radome.

The near field measurements taken on the antenna and radome may be used to determine the far field properties of the antenna and radome. The region farther from the antenna where the antenna's electromagnetic fields are mostly radiative is called the far field or Fraunhofer region. In the far field region, the antenna's radiation pattern is substantially not dependent on the distance from the antenna.

Figure 1:
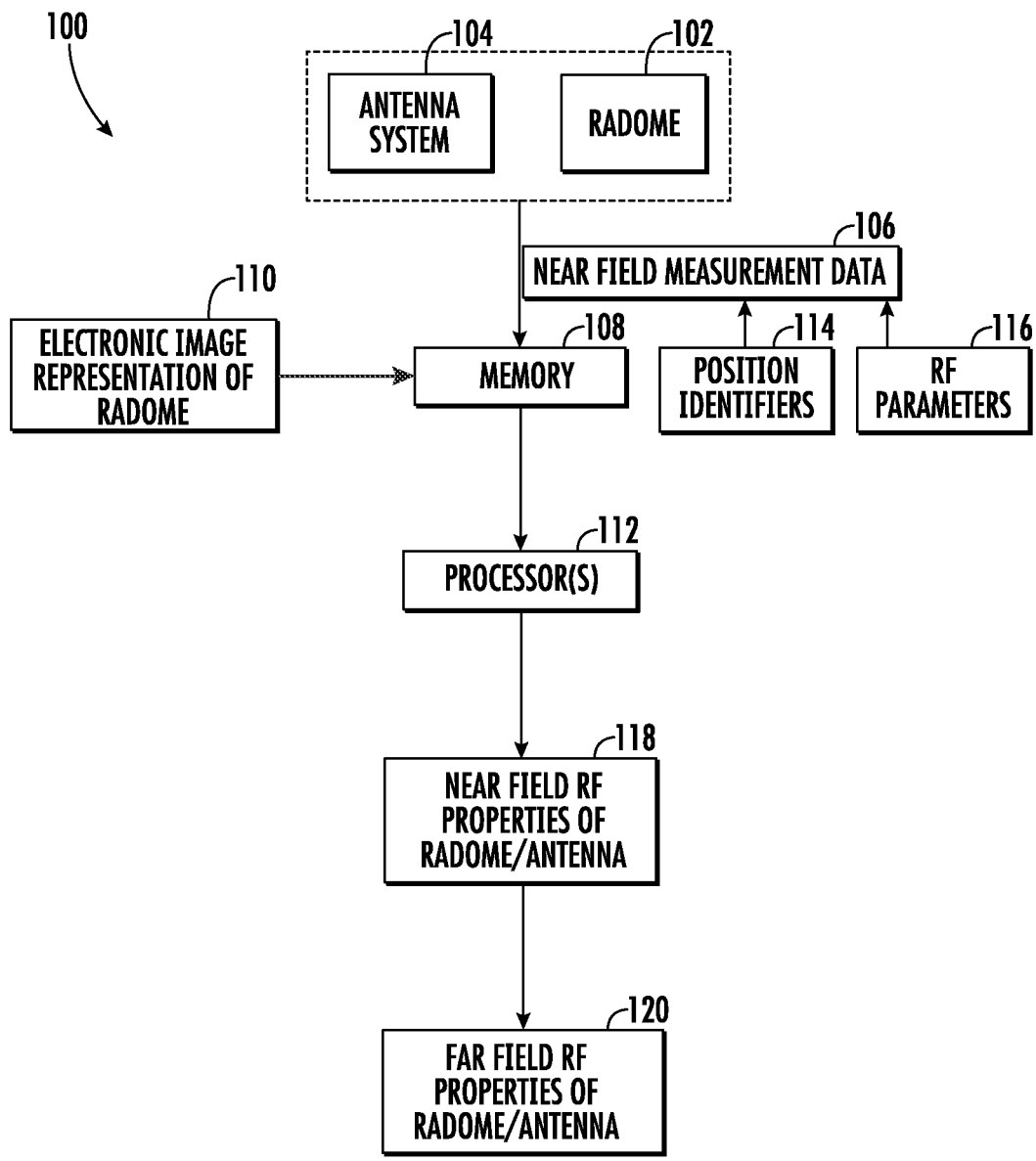
FIG. 1 is a block diagram of an example of an RF characterization system.

Referring to FIG. 1, an example of an RF characterization system 100 for testing a radome 102 includes at least one processor 112 that executes program instructions to determine RF characteristics of the radome 102 and antenna system 104 under test. The RF characteristics of the radome 102 and antenna system 104 under test may include characteristics of how the radome affects the performance of the antenna system 104 and, therefore, such RF characteristics may include antenna system 104 performance characteristics with respect to the particular radome 102 under test. Near field measurement data 106 of the radome 102 and antenna system 104 are measured and saved in non-transitory machine readable memory 108, which further stores an electronic image representation 110 of the radome 102 under test. The antenna system 104 may include a single antenna or more than one antenna.

The processor 112 retrieves the near field measurement data 106 from the memory 108. The near field measurement data 106 include a plurality of position identifiers 114 that identify geographic-like positions or coordinates on the radome 102 where the near field measurement data were measured and RF parameters 116 measured at the positions on the radome 102 where the near field measurement data were measured.

The processor 112 also receives from the memory 108 an electronic image representation 110 of the radome 102. The electronic image representation 110 includes positions on the radome corresponding to the position identifiers 114. These positions may be identified by a geographic-like indicators or coordinates that tell the processor 112 the position is relative to the surface of the radome 102 in the electronic image representation 110. The electronic image representation 110 may be a digital image, CAD file, point cloud, or the like. In the electronic image representation 110, the surface of the radome 102 is electronically represented and the position identifiers 114 are incorporated. In this manner, the electronic image representation 110 is a digital model that replicates the physical structure of the radome 102 with the position identifiers 114 on the actual, tangible radome 102 being represented by corresponding position identifiers 114 at the same position on the electronic image representation 110. A point cloud, for example, is a set of data points in three-dimensional space that represents the three-dimensional shape of the radome 102, with each point having its own set of three-dimensional coordinates representing the location of each point in the three-dimensional space.

The processor 112 determines the near field RF properties 118 of the radome 102 and antenna system 104 under test by combining the near field measurement data 106 and the electronic image representation 110. This permits the system 100 to provide a three-dimensional image or dataset of the near field properties of the radome 102 at each of the positions on the radome 102 corresponding to the position identifiers 114. Accordingly, the radome's 102 near field properties can be mapped onto the electronic image representation 110 with each position identifier corresponding to a known geographic location or coordinate on the surface of the radome 102.

The processor 112 may further use the near field RF properties 118 of the radome 102 to determine the far field RF properties 120 of the radome 102 using near field to far field transformation electromagnetic calculations.

Figure 2:
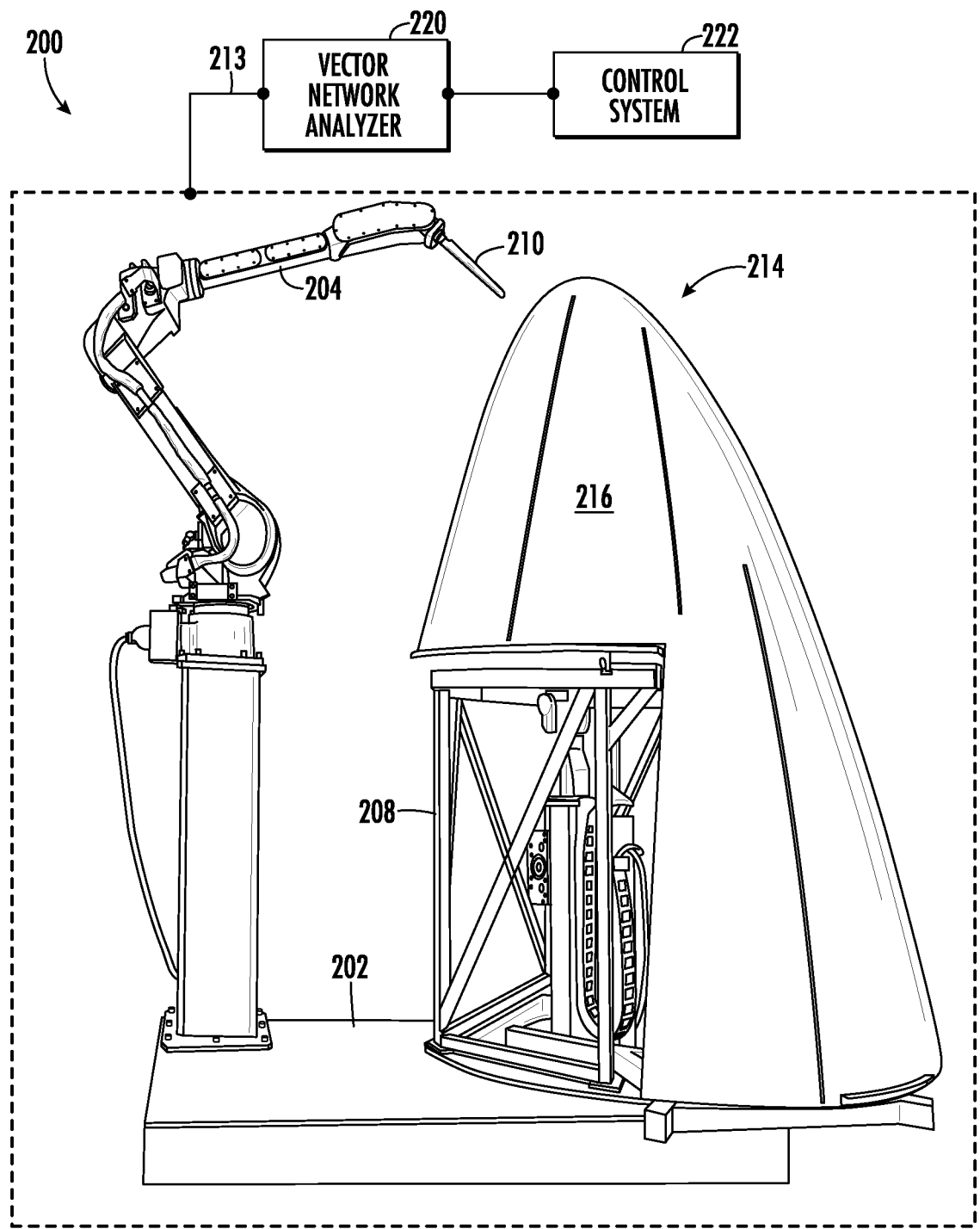
FIG. 2 is a diagram of another example of an RF characterization system, showing the exterior of an example of a radome.
Figure 3:
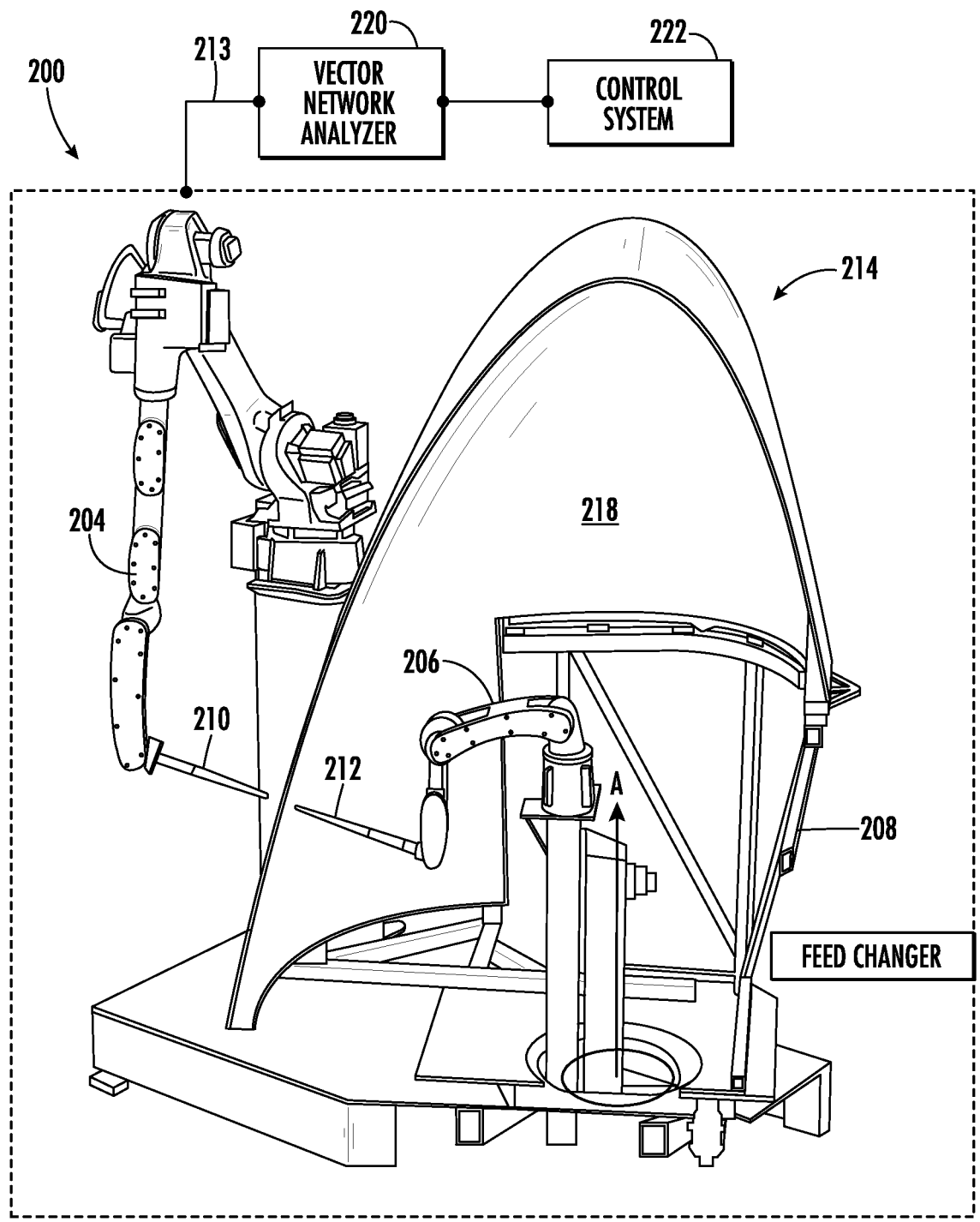
FIG. 3 is a diagram of the RF characterization system of FIG. 2, showing the interior of the radome.

Referring to FIGS. 2 and 3, a more particular example of the system 200 for testing a radome 214 includes a base 202 supporting an exterior robotic arm 204 an interior robotic arm 206 and a radome support member 208. The exterior robotic arm 204 holds an exterior antenna 210 at a terminal end thereof. The interior robotic arm 206 holds an interior antenna 212 at a terminal end thereof. The radome support member 208 is constructed in such a way that it can upwardly support a radome 214 under test. The radome support member 208 may further be constructed to rotate the radome 214 about a vertical axis A thereof as indicated by the arrows around the axis A.

The exterior robotic arm 204 and interior robotic arm 206 are each configured in such a way that they can independently reposition the exterior antenna 210 and interior antenna 212, respectively, with respect to the exterior surface 216 and interior surface 218 of the radome 214. This permits near field RF characterization of substantially the entire surface of the radome 214 using different incidence angles, frequencies, and polarizations.

A vector network analyzer 220 is in signal communication with the exterior antenna 210 and interior antenna 212 via at least one RF signal throughput device 213 such as a coaxial cable or the like. The vector network analyzer 220 analyzes the RF spectrum information for one or both antennae and provides the RF spectrum information to a control system 222.

The control system 222 includes the at least one processor 112 and memory 108. The processor 112 may execute the functions discussed above and also executes program instructions to move the exterior antenna 210 and interior antenna 212 with the exterior robotic arm 204 and the interior robotic arm 206, respectively, to different positions relative to the radome 214 that correspond to the position identifiers 114.

The control system 222 is a computing device that includes a processor 112, memory 108, and may also include an I/O interface, a network adapter, and a display. These features may communicate with each other through a bus or wirelessly and may be located within a single device or be divided across multiple devices.

An example of the processor 112 is a computer microprocessor such as one that includes one or more processing units such as a central processing unit (CPU) and a graphical processing unit (GPU). The control system 222 may include one or more of the processors 112. In some cases, one or more of the processors 112 may be accessed remotely relative to one or more of the other processor(s) 112.

An example of the memory 108 includes nontransitory memory containing non-transitory computer executable program instructions. Examples of such memory 108 include a random access memory (RAM), a hard disk, a removable storage device, or remote memory such as cloud storage.

The memory 108 stores data and executable program instructions, such as software programs, for performing various computing functions. The processor 112 is capable of executing the program instructions stored on the memory 108 to cause the control system 222 to perform computing operations consistent with the systems and methods disclosed herein.

An example of an I/O interface includes hardware and software for communication with the control system 222 by a user. The I/O interface may include, for example, a keyboard, mouse, touch screen, camera, microphone, speaker, and the like.

An example of the network adapter includes hardware and software for allowing the control system 222 to communicate information over a network. Examples of the network adapter may include, for example, a local area network (LAN) adapter, a wireless wide area network (WWAN) adapter, a Bluetooth® module, a near field communication adapter, or the like.

The memory 108 and processor 112 need not be housed at the same location or within the same computer.

When characterizing a radome and antenna combination, one of the antennae 210, 212 may be selected as the transmit antenna that transmits the RF signal incident on the radome 214 while the other serves as a receive antenna for characterizing a receive signal on the opposite side of the radome 214 from the transmit antenna. The transmit antenna will typically be the interior antenna 212 because the antenna on an aircraft will be in the interior of the radome 214, but it is possible for both antennae 210, 212 to serve as transmit and receive antenna or for the exterior antenna 210 to serve as the transmit antenna while the interior antenna 212 serves as the receive antenna.

Referring to FIGS. 1-4, the vector network analyzer 220 measures the RF parameters 116 of the radome 214 using the antennae 210, 212 while the radome 214 is positioned between them in order to characterize how the radome 214 affects the radiation from the transmit antenna to the receive antenna. Such RF parameters may include the S parameters (S11, S12, S22, S21), which include insertion loss, insertion phase delay, return loss, and return phase delay. The vector network analyzer 220 feeds the RF parameters 116 to the control system 222.

For a given RF parameter measurement, the control system 222 also receives the radiation frequency, polarization, and incidence angle. The control system 222 further records the radome position, the exterior antenna 210 position, and the interior antenna 212 position. The radome 214 position is the rotational angle of the radome 214 on the base 202. The exterior antenna 210 position and the interior antenna 212 position are the respective positions of each antenna relative to the radome 214 position.

Referring to FIG. 5, different positions on the surface of the radome 214 are marked with points. Each point represents a specific geographic location or coordinate on the exterior surface 216 of the radome 214. The memory 108 stores these points in such a way that each point corresponds to a specific three dimensional geographic location on the exterior surface 216 of the radome 214. Each point is assigned a position identifier 114, which identifies the location of that particular point on the radome 214. The position identifier 114 may be a set of coordinates or the equivalent thereof on the radome's exterior surface 216 or interior surface 218.

As discussed above, the memory 108 also stores an electronic image representation 110 of the radome 102, which is a three dimensional graphical representation of the radome's 214 exterior 216 and/or interior 218 surface where the points in FIG. 5 are mapped onto their corresponding geographic locations in the electronic image representation 110. Accordingly, the position identifiers 114 represent the same location on the radome's 214 surface as the position in the electronic image representation 110. The electronic image representation 110 may be digital image, CAD file, point cloud, or the like.

Figure 4:
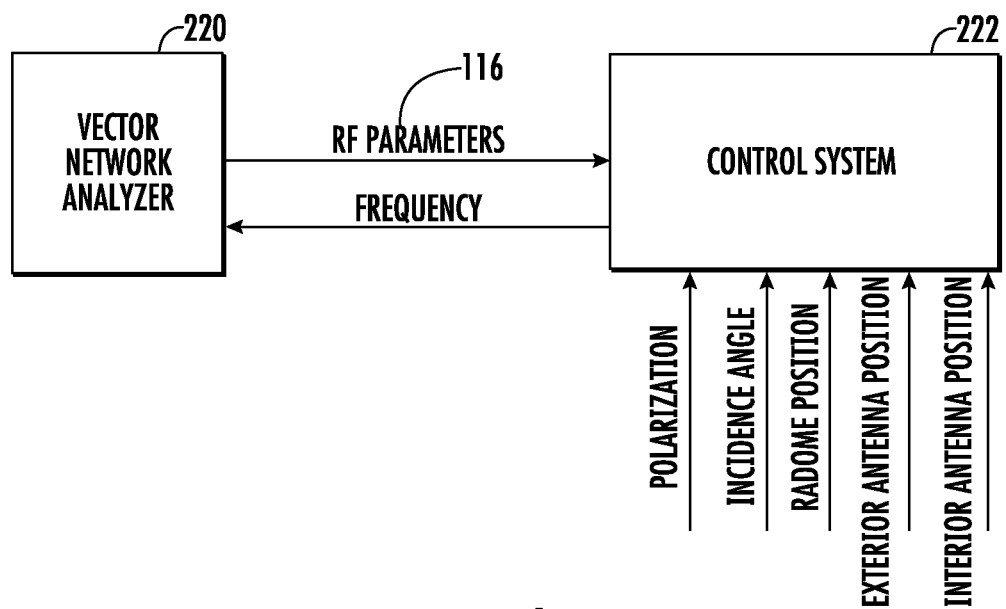
FIG. 4 is a block diagram showing functions of the vector network analyzer and the control system.

In use, the exterior antenna 210 and interior antenna 212 are moved to the different positions adjacent the radome 214 and the measurements of FIG. 4 are input into the control system 222 at each position with a position identifier 114. The exterior robotic arm 204 and interior robotic arm 206 receive control signals from the control system 222 to position the exterior antenna 210 and interior antenna 206, respectively, a fixed distance from the radome's 214 outer mold line and inner mold line at a finite number of points under test on the radome's 214 surface. The two antennae 210, 212 are maintained at a fixed distance from one another with their boresight directions aligned to each other. The control system 222 triggers the vector network analyzer 220 to collect RF parameters 116 over the desired frequency range at the given point and antenna orientation.

The robotic arms 204,206 may rotate the antennas 90° about their boresight to collect the alternative polarization, or a 4-port network analyzer may be used with four total antennas, mounted in two orthogonal pairs to collect the opposite polarization. The robotic arms 204, 206 may move the antennae 210, 212 such that the point under test remains between the two antennae 210, 212 while the incidence angle relative to the radome 214 surface normal is changed. This process may be repeated for multiple incidence angles and polarizations for at each measurement point. The robotic arms 204, 206 may then move to the next point under test and repeat the measurements.

The system 200 may also include a feed changer that allows the interior robotic arm 206 to select which antenna is under test from a selection of antennas and position them in their respective nominal locations as necessary for each run of measurements. The feed changer may also change out the interior antenna 212 from a transmit unit under test to a probe antenna for performing the S-parameter data collection.

Figure 7:
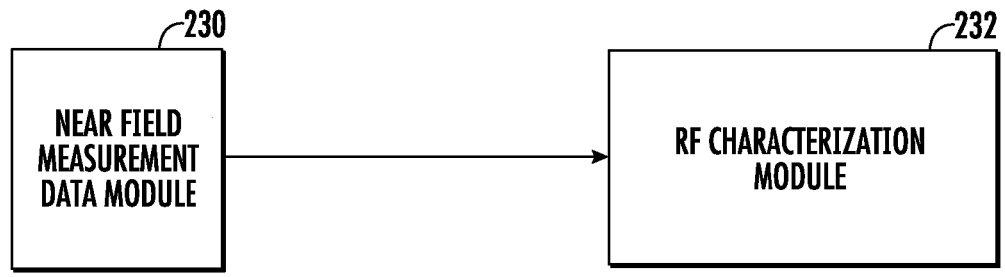
FIG. 7 is a block diagram, showing an example of the RF characterization module.

Referring now to FIGS. 6 and 7, the processor 112 executes a near field measurement data module 230 with program instructions that generate a reference dataset 228 of the near field measurement data input parameters to the control system 222 in FIG. 4 at every position on the radome's 214 surface with a position identifier 114.

In the table of FIG. 6 of the reference dataset 228 there are an arbitrary number of position identifiers 114 (Position 1, 2, . . . . N) up to N. For each N position identifier, the reference dataset 228 includes the following RF parameters 116: frequency, polarization, incidence angle, S parameters measured at the position corresponding to the specified position identifier 114. Once the reference dataset 228 for the radome 214 is completed, it provides a three dimensional representation of how the radome 214 behaves at the specified input parameters.

Referring to FIG. 7, the processor 112 executes an RF characterization module 232 that performs electromagnetic computations that analyze the transmit antenna's, receive antenna's, or both the transmit and receive antenna's performance given a radome 214 characterized by the reference dataset 228 of the radome 214 that underwent testing. The resulting computations can determine the near field RF properties 118 of the radome/antenna under test combination and the far field RF properties of the radome/antenna combination under test. Near field RF properties 118 of the radome may include, the measured S parameters of the radome 214 in the reference dataset 228.

The RF characterization module 232 combines the reference dataset 228 with the electronic image representation 110 in such a way that the RF parameters 116 at each position identifier 114 are input into the electronic image representation 110 dataset. This combination yields a three-dimensional dataset that digitally represents the radome 214 and includes the measured RF parameters 116 at each location of a position identifier 114.

Far field RF properties 120 of the radome may include, for example, radome insertion loss, beam deflection error, beam deflection error slope, sidelobe levels, null depth variation, cross-polarization discrimination, and other desired antenna performance parameters. It should be understood that the near field RF properties 118 and the far field RF properties 120 of the radome/antenna combination, respectively, may include near field and far field antenna performance properties of the transmit antenna under test with the radome under test.

The RF characterization module 232 models the radome's 214 surface with the reference dataset 228 generated from the measured data serving as the surface definition of the radome 214. Because the measured data is of the radome and antenna performance for plane wave incidence, the model can incorporate various antenna definitions without requiring re-collection of data. This enables the RF characterization module 232 to calculate the effects of the radome 214 on antenna performance for an arbitrary antenna definition including: multiple positions within the radome, multiple aperture sizes, multiple aperture distributions, and/or multiple scan or pointing directions.

The RF characterization module 232 may use electromagnetic calculation algorithms to simulate RF characteristics of the radome/antenna combination. Such algorithms may include, for example, geometrical optics computational electromagnetics, shooting and bouncing rays, or the like. In a particular example, ray tracing is used to calculate the beam deflection error and insertion loss using the measured insertion loss and insertion phase delay (transmission performance) of the radome 214 and transmit antenna. The RF characterization module 232 can make use of multi-bounce ray tracing to calculate antenna pattern performance (e.g., sidelobe levels, null-depth) using measured transmission and reflection performance of the radome from the full S-parameter data set in the reference dataset 228. Alternatively, the RF characterization module 232 can perform near-field-to-far-field transforms of the measured near-field data in the reference dataset 228 of an actual antenna under test to derive pattern information.

The RF characterization module 232 can pre-calculate the ray tracing locations for a given antenna location, number of radiating elements, and radome shape, such that subsequent analysis of multiple aperture weightings or measured S-parameters do not require the re-evaluation of the ray paths. This allows for the rapid assessment of antenna performance for a given antenna/radome geometry for multiple radomes under test or for multiple beam pointing directions.

Figure 8:
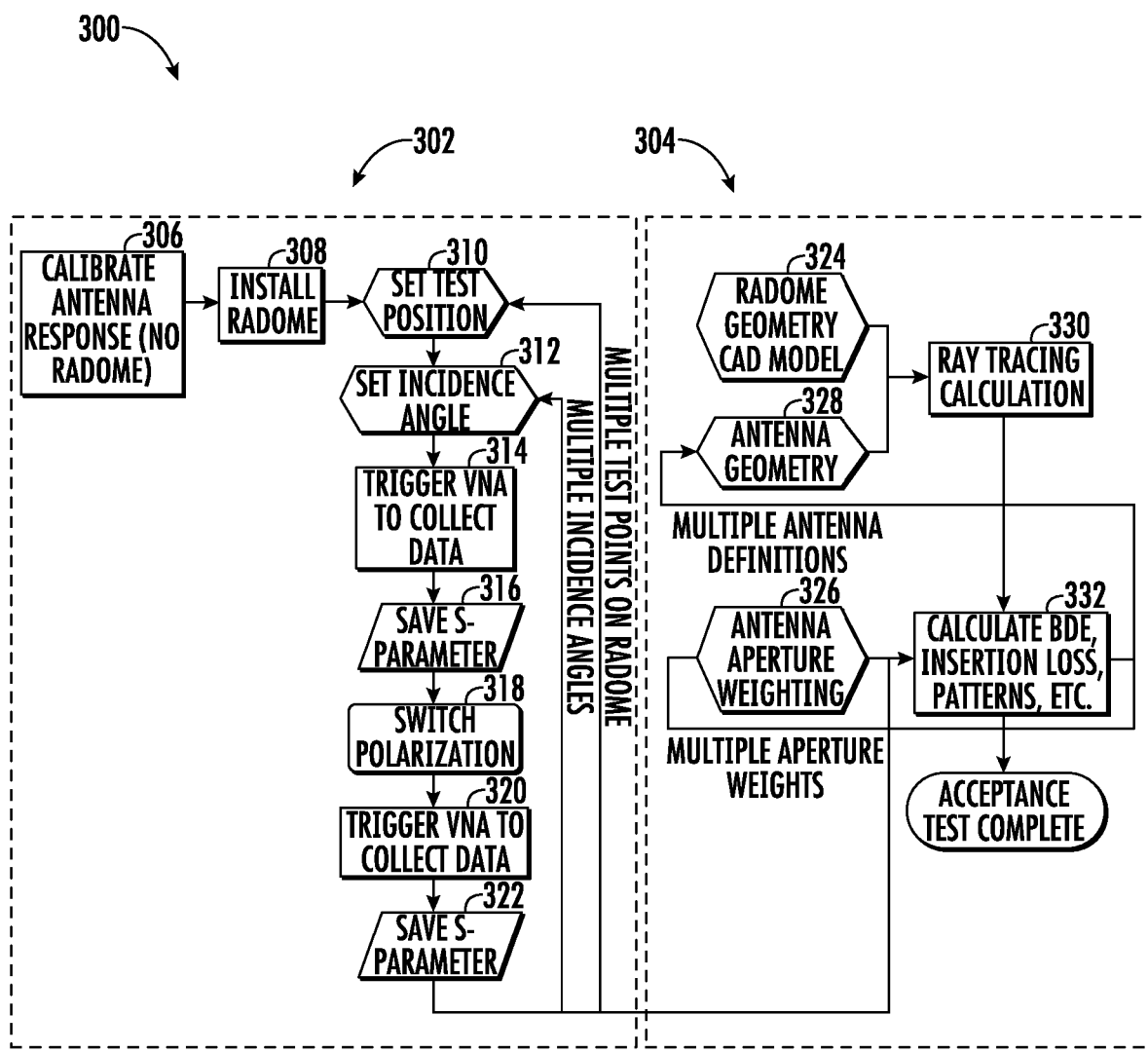
FIG. 8 is a flow diagram of an example of a radome testing method.

Referring to FIG. 8, an example of a radome testing method 300 using the system 100 or system 200 will be described. The method includes a measurement portion 302 and an analysis portion 304.

At block 306, the exterior antenna 210 and interior antenna 212 are calibrated with no radome 214 between them. The radome 214 is subsequently installed 308 in preparation for a run of measurements on the radome 214.

At block 310, the control system 222 moves the exterior antenna 210 and interior antenna 212 into a first measurement position using the respective robotic arms 204, 206.

At block 312, the control system 222 moves the exterior antenna 210 and interior antenna 212 into a desired incidence angle at the first measurement position using the respective robotic arms 204, 206 and at block 314 the vector network analyzer 220 collects the RF parameters 316 at that measurement point and incidence angle. The corresponding RF parameters 316 are stored in the memory 108.

At block 318, the antenna polarization is changed and the vector network analyzer 220 collects the RF parameters 320 at the first measurement point and the new polarization. At block 322, the corresponding S-parameters are stored in the memory 108.

The control system 222 repeats the cycle from blocks 312-322 at multiple other incidence angles at every test position on the radome's 214 surface. The data from the measurements are stored in the memory 108 in the reference dataset 228.

The control system 222 moves the exterior antenna 210 and interior antenna 212 to each desired test position and repeats blocks 312-322 at every incidence angle and polarization.

The reference dataset 228 for these measurements is fed to the RF characterization module 232, which performs electromagnetic calculations to characterize the subject antenna's performance using the reference dataset 228 as an input to the calculations. A second input used by the RF characterization module 232 for the calculations is a radome geometry model 324, which is the electronic image representation 110.

At block 326, the RF characterization module 232 performs calculations characterizing the subject antenna using multiple different antenna aperture weights.

At block 328, the RF characterization module 232 performs calculations characterizing the subject antenna using multiple different antenna geometries. At block 330, these data are used by the RF characterization module 232 to perform the ray tracing calculations.

At block 332, the ray tracing calculation data and the antenna aperture weighting calculations are then used by the RF characterization module 232 to perform the final calculations on the subject antenna with respect to the radome under test, such as the near field RF properties 118 and the far field RF properties 120 of the radome 214.

Advantageously, the system 100 does not require the use of the actual radar antenna that will be used with the radome under test. Instead, the reference dataset 228 is used to predict, through the electromagnetic calculations, the RF pattern effects of the radome on an arbitrary antenna to be installed on the interior of the radome 214.

The system 100, 200 can be used is to simulate the far field antenna patterns of the transmitting antenna under test. Here, the interior antenna 212 transmits a fixed-beam at the nominal location of that interior antenna relative to the radome's 214 interior surface 218. The exterior antenna 210 then collects near-field data over a spherical surface enclosing the interior antenna 212 under test. Near-field-to-far-field transforms are then used to yield the far field antenna patterns of the transmitting interior antenna. Because of the directivity of the external antenna, no anechoic chamber is required for this test.

The system 100, 200 and related methods can be used to predict the pattern effects of the radome that underwent testing as described above on an different arbitrary antenna to be installed under the radome. Because the near field properties of the radome are known, they can be used as the input for the electromagnetic calculations that predict how the radome will affect the pattern of the different arbitrary antenna.

The systems and methods are not limited to the details described in connection with the example embodiments. There are numerous variations and modification of the systems and methods that may be made without departing from the scope of what is claimed.

That which is provisionally claimed is:

1. A method comprising:
   determining, by a processor, near field properties of a radome and antenna by combining near field measurement data of the radome and antenna with an electronic image representation of the radome;
   the near field measurement data including (a) position identifiers that identify positions on the radome where the near field measurement data were measured and (b) RF parameters measured at the positions on the radome identified by the position identifiers; and
   the electronic image representation of the radome including positions thereon corresponding to the position identifiers.

2. The method of claim 1, wherein the RF parameters include S parameters.

3. The method of claim 1, wherein the near field measurement data further include (c) incidence angles of the antenna relative to the radome at the positions on the radome identified by the position identifiers.

4. The method of claim 1, wherein the near field properties include at least one of insertion loss, beam deflection error, beam deflection error slope, sidelobe levels, null depth variation, and cross-polarization discrimination.

5. The method of claim 1, further comprising determining far field RF properties of the radome from the near field properties of the radome.

6. The method of claim 1, further comprising predicting pattern effects of the radome from a different antenna using the near field properties.

7. The method of claim 1, wherein the electronic image representation of the radome is a digital three-dimensional representation of the radome.

8. A system comprising a processor that executes program instructions to characterize a radome and antenna by:
   determining, by the processor, near field properties of the radome and antenna by combining near field measurement data of the radome and an electronic image representation of the radome;
   the near field measurement data including (a) position identifiers that identify positions on the radome where the near field measurement data were measured and (b) RF parameters measured at the positions on the radome identified by the position identifiers; and the electronic image representation of the radome including positions thereon corresponding to the position identifiers.

9. The system of claim 8, wherein the RF parameters include S-parameters.

10. The system of claim 8, wherein the near field measurement data include (c) incidence angles of the antenna relative to the radome at the positions on the radome identified by the position identifiers.

11. The system of claim 8, wherein the near field properties include at least one of insertion loss, beam deflection error, beam deflection error slope, sidelobe levels, null depth variation, and cross-polarization discrimination.

12. The system of claim 8, wherein the processor further executes program instructions to determine far field RF properties of the radome and antenna from the near field properties of the radome and antenna.

13. The system of claim 8, wherein the processor further executes program instructions to predict RF pattern effects of the radome from a different antenna using the near field properties.

14. The system of claim 8, wherein the electronic image representation of the radome is a digital three-dimensional representation of the radome.

15. An RF characterization system comprising:
a radome supported by a radome support member;
a transmit antenna positioned on a first side of the radome by a first robotic arm;
a receive antenna positioned on a second side of the radome by a second robotic arm;
a vector network analyzer in communication with the transmit antenna and receive antenna;
a processor that executes program instructions to determine how the radome affects RF characteristics of the transmit antenna by:
moving the transmit antenna and the receive antenna with the first robotic arm and the second robotic arm, respectively, to different positions of the radome; and
collecting near field measurement data of the radome and antenna at the different positions, the near field measurement data including (a) a plurality of position identifiers that identify the different positions on the radome where the near field measurement data were measured and (b) RF parameters measured at the different positions on the radome identified by the position identifiers.

16. The RF characterization system of claim 15, wherein the processor further executes program instructions to determine how the radome affects RF characteristics of the antenna by:
receiving an electronic image representation of the radome, the electronic image representation of the radome including positions thereon corresponding to the position identifiers; and
obtaining near field RF properties of the radome, transmit antenna, and receive antenna by combining the near field measurement data and the electronic image representation.

17. The RF characterization system of claim 15, wherein the RF parameters include S-parameters.

18. The RF characterization system of claim 15, wherein the near field measurement data include (c) incidence angles of the transmit antenna relative to the radome at the positions on the radome identified by the position identifiers.

19. The RF characterization system of claim 15, wherein the RF parameters include at least one of insertion loss, beam deflection error, beam deflection error slope, sidelobe levels, null depth variation, and cross-polarization discrimination.

20. The RF characterization system of claim 16, wherein the processor further executes program instructions to determine far field RF properties of the radome and antenna from the near field RF properties.

21. The RF characterization system of claim 16, wherein the processor further executes program instructions to predict pattern effects of the radome from a different antenna using the near field RF properties.

22. The RF characterization system of claim 16, wherein the electronic image representation of the radome is a digital three-dimensional representation of the radome.

23. A system for predicting pattern effects of a radome on a test antenna, the system comprising a processor that executes program instructions to:
calculate pattern effects of the radome on the test antenna using near field measurement data and an electronic image representation of the radome;
the near field measurement data including (a) a plurality of position identifiers that identify positions on the radome where the near field measurement data were measured and (b) RF parameters measured at the positions on the radome identified by the position identifiers; and
the electronic image representation of the radome including positions thereon corresponding to the position identifiers.

* * * * *